United States Patent
Lee

(10) Patent No.: US 8,105,063 B1
(45) Date of Patent: Jan. 31, 2012

(54) THREE PIECE MOLD CAVITY DESIGN FOR PACKAGING INTEGRATED CIRCUITS

(75) Inventor: Lee Han Meng @Eugene Lee, Muar (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/869,630

(22) Filed: Aug. 26, 2010

(51) Int. Cl.
*B29C 70/72* (2006.01)
*H01L 21/56* (2006.01)

(52) U.S. Cl. .......................................... 425/89; 425/116
(58) Field of Classification Search ............ 425/89, 425/116
See application file for complete search history.

(56) References Cited

U.S. PATENT DOCUMENTS

| | | | | |
|---|---|---|---|---|
| 3,615,946 A | * | 10/1971 | Palmer | 438/125 |
| 5,365,655 A | * | 11/1994 | Rose | 264/272.17 |
| 5,958,466 A | * | 9/1999 | Ong | 425/127 |
| 6,534,338 B1 | * | 3/2003 | Schoonejongen et al. | 438/107 |
| 6,596,212 B1 | * | 7/2003 | LoBianco et al. | 264/219 |
| 6,747,345 B1 | * | 6/2004 | Bolken | 425/116 |
| 7,241,414 B2 | * | 7/2007 | Ho et al. | 425/89 |

FOREIGN PATENT DOCUMENTS

JP 2004153045 A * 5/2004

* cited by examiner

*Primary Examiner* — Robert B Davis
(74) *Attorney, Agent, or Firm* — Beyer Law Group LLP

(57) ABSTRACT

One aspect of the present invention relates to a molding system for use in packaging integrated circuits. The molding system includes a top cavity bar, a middle cavity bar, a bottom cavity bar, a tape and an injection unit. When an electronic substrate is positioned between the top and middle cavity bars, the top and middle cavity bars are arranged to sandwich the electronic substrate. The top and middle cavity bars are also arranged to help form one or more mold cavities over device areas of the electronic substrate. The tape is positioned below the middle cavity bar and is arranged to cover and relieve pressure on a bottom of each mold cavity. The bottom cavity bar is positioned below the tape and is arranged to support the tape. The injection unit is arranged to inject a molding material into the mold cavities.

11 Claims, 6 Drawing Sheets

US 8,105,063 B1

THREE PIECE MOLD CAVITY DESIGN FOR PACKAGING INTEGRATED CIRCUITS

FIELD OF THE INVENTION

The present invention relates to the packaging of integrated circuits. Various aspects of the present invention relate to methods and arrangements for applying molding material to encapsulate portions of an electronic substrate.

BACKGROUND OF THE INVENTION

There are a number of conventional processes for packaging integrated circuit (IC) dice. In one such process, integrated circuit dice are physically and electrically connected to a leadframe panel. The leadframe panel is made of an electrically conductive metal. Eventually, electrical interconnects for each package are formed from the leadframe panel. Afterward, the leadframe panel is placed in a molding system. A molding material is applied to encapsulate the dice and portions of the leadframe panel.

FIGS. 1A and 1B illustrate an exemplary encapsulation process. The leadframe panel 104 is positioned between a top cavity bar 102a and a bottom cavity bar 102b. Each cavity bar includes multiple pockets or recesses 120a-120b. FIG. 1B is an enlarged side view of portions of the structures illustrated in FIG. 1A. The top and bottom cavity bars 102a-102b are pressed together over the leadframe panel 104. A recess 120a of the top cavity bar 102a aligns with a recess 120b in the bottom cavity bar 102b to form a mold cavity 110. The mold cavity 110 covers an integrated circuit die 112 that is mounted on the leadframe panel 104.

Afterward, molding material is injected into the mold cavity 110. The encapsulated leadframe panel 104 is then removed from the molding system and singulated to form multiple integrated circuit packages. Each package has a protective housing that is formed from the molding material.

While the above arrangements and methods work well, there are continuing efforts to develop improved packaging techniques that provide cost effective approaches for meeting the needs of a variety of different packaging applications.

SUMMARY OF THE INVENTION

In one aspect of the present invention, a molding system for use in packaging integrated circuits is described. The molding system includes a top cavity bar, a middle cavity bar, a bottom cavity bar, a tape and an injection unit. When an electronic substrate (e.g., a leadframe panel populated with integrated circuit dice) is positioned between the top and middle cavity bars, the top and middle cavity bars are arranged to sandwich the electronic substrate. The top and middle cavity bars are also arranged to help form one or more mold cavities over device areas on the electronic substrate. The tape is positioned below the middle cavity bar and is arranged to cover and relieve pressure on a bottom of each mold cavity. The bottom cavity bar, which is positioned below the tape and the middle cavity bar, is arranged to support the tape. The injection unit is arranged to inject a molding material into the mold cavities.

In another aspect of the invention, a method for packaging integrated circuits is described. The method involves positioning an electronic substrate between a top cavity bar and a middle cavity bar in a molding system. The electronic substrate includes a plurality of device areas that each support one or more integrated circuit dice. The top cavity bar and the middle cavity bar are aligned over the electronic substrate to form one or more mold cavities around the dice. A tape is sandwiched between the middle cavity bar and a bottom cavity bar to help relieve pressure on the integrated circuit dice within the mold cavities. Molding material is injected into the one or more mold cavities to encapsulate the integrated circuits and portions of the electronic substrate.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. More generally, the present invention relates to improved methods and arrangements for encapsulating integrated circuits. Various embodiments of the present invention relate to a molding system that includes three cavity bars and a tape that helps to protect the back surface of a die when the die is being encapsulated in molding material.

Conventional molding systems, while effective for many applications, have been found to be less suitable for particular IC package designs. By way of example, some package designs involve an integrated circuit die whose back surface is intended to be exposed on the exterior of the package. The exposed back surface can substantially improve the dissipation of heat from the embedded die. When this package design is combined with the aforementioned encapsulation process, however, there is a risk of damaging the die, as will be discussed below with reference to FIG. 2.

Figure 1A:
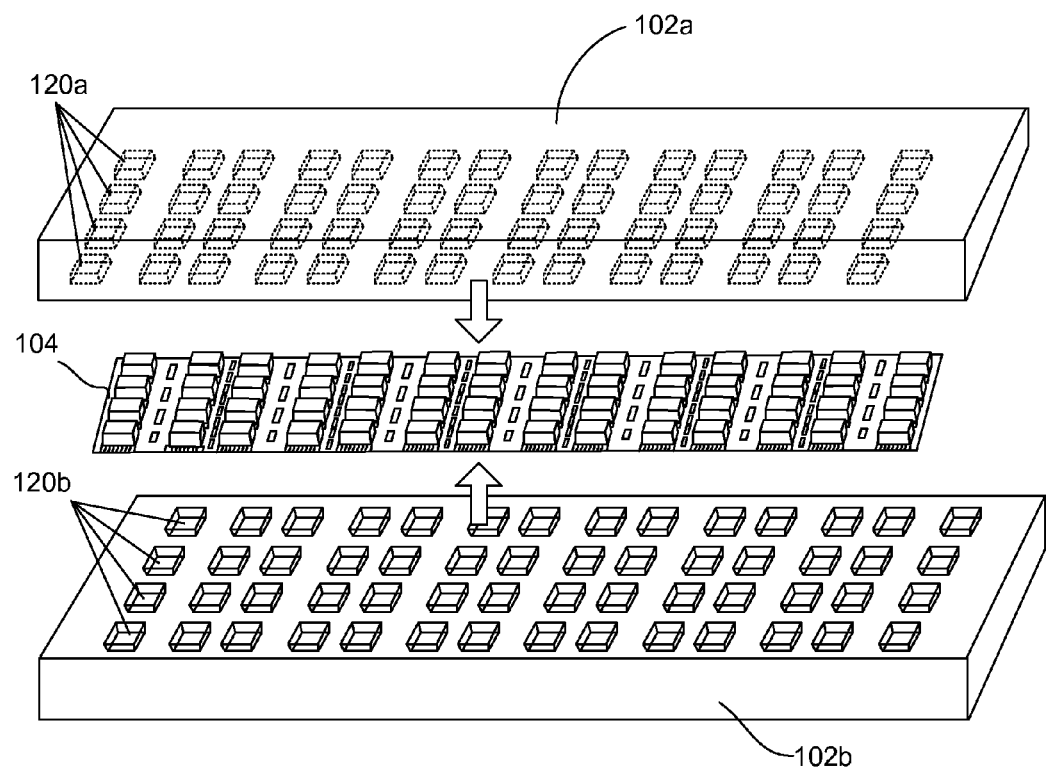
FIG. 1A is a diagrammatic perspective view of an example molding system.
Figure 1B:
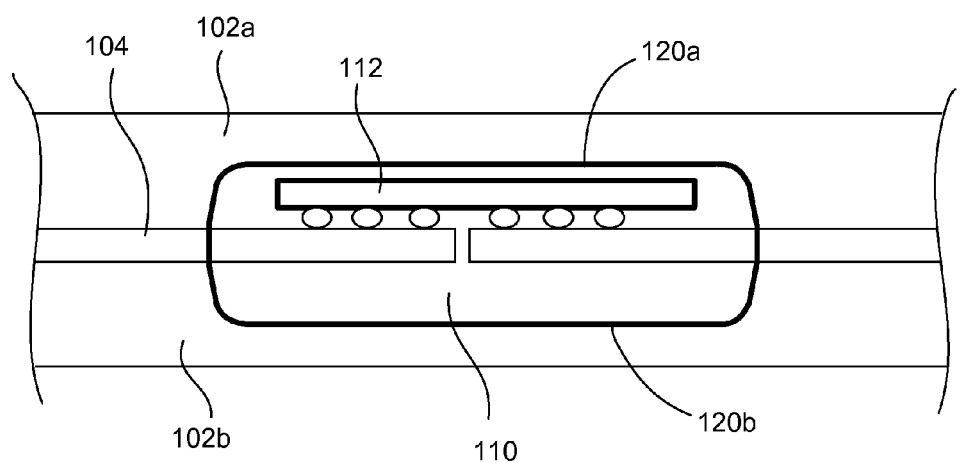
FIG. 1B is a diagrammatic side view of the molding system illustrated in FIG. 1A.
Figure 2:
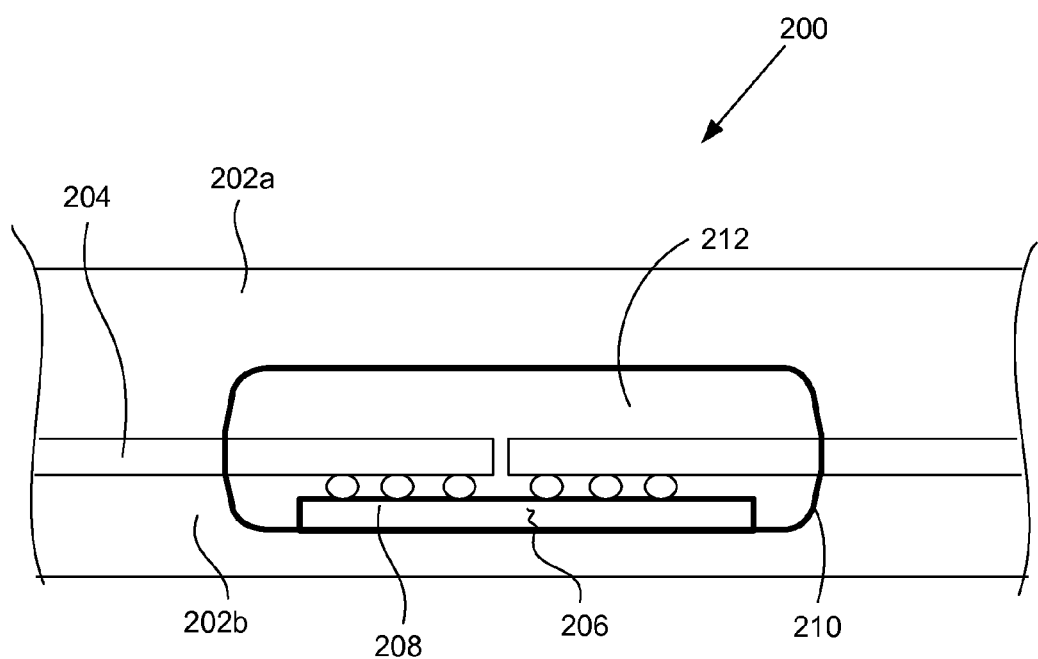
FIG. 2 is a diagrammatic side view of an exemplary molding system.

FIG. 2 illustrates a leadframe 204 that is positioned between a top cavity bar 202a and a bottom cavity bar 202b. An integrated circuit die 208 is attached with the leadframe 204. The top and bottom cavity bars 202a-202b collectively form a mold cavity 210 around the die 208. The die 208 is positioned at the bottom of the mold cavity 210 and is pressed flush against the bottom cavity bar 220b. Molding material 212 is injected into the mold cavity 210 to encapsulate portions of the die 208 and the leadframe 204.

During the encapsulation process, the bottom cavity bar 202b applies considerable pressure on the die 208. This approach helps prevent molding material 212 from covering the back surface of the die. However, the pressure may have an undesirable consequence. More specifically, if the back surface of the die is slightly uneven or not coplanar with the surface of the bottom cavity bar 202b, the pressure may damage the die 208, as indicated by the crack 206.

Figure 3A:
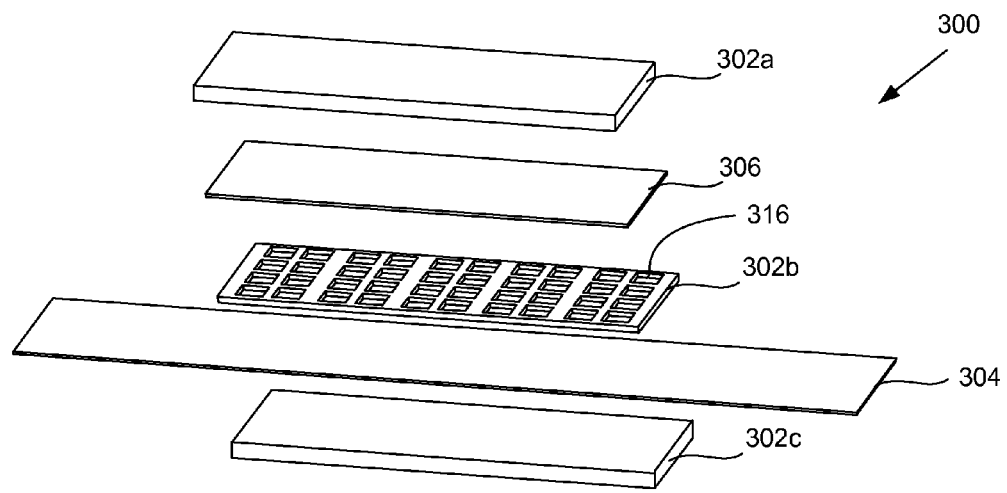
FIGS. 3A and 3B are diagrammatic perspective views of a molding system according to a particular embodiment of the present invention.
Figure 3B:
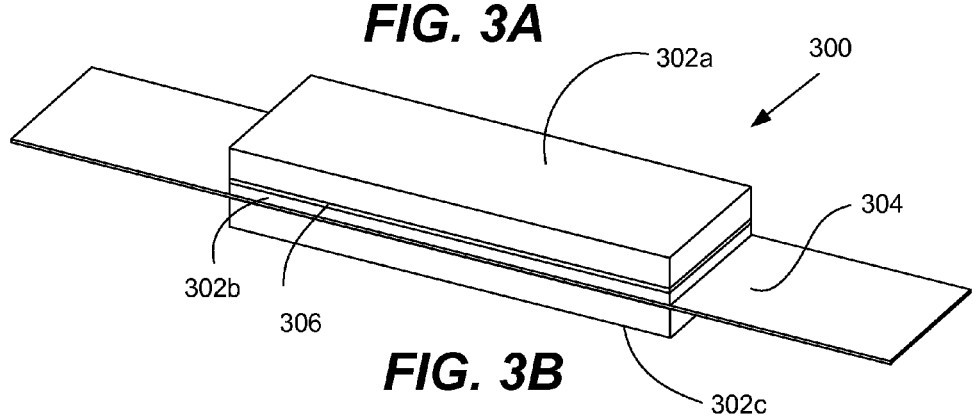
Figure 3C:
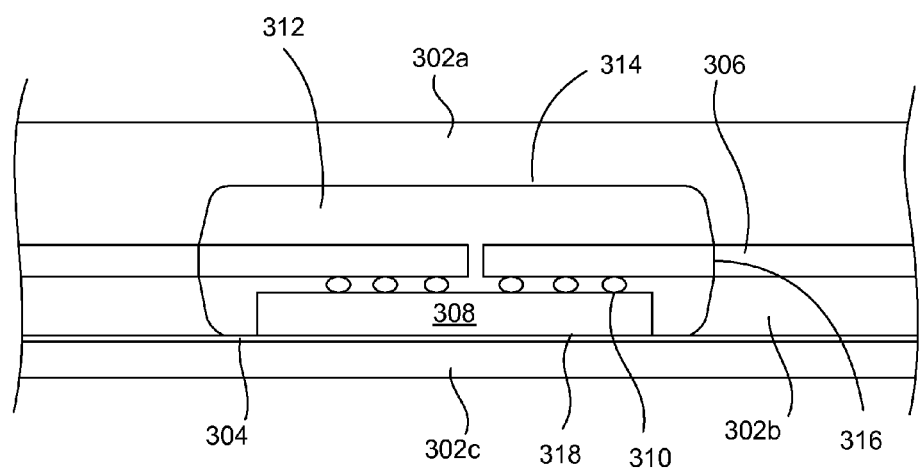
FIG. 3C is a diagrammatic side view of a portion of the molding system illustrated in FIG. 3A.

The present invention addresses this and/or other issues. Various implementations involve a molding system with 3 cavity bars and a tape that helps absorb pressure received by the back surface of the die. Referring initially to FIGS. 3A-3C, a molding system 300 according to a particular embodiment of the present invention will be described. FIG. 3A is an exploded view of the molding system 300, which includes a top cavity bar 302a, a middle cavity bar 302b, a bottom cavity bar 302c and a tape 304. An electronic substrate 306 (e.g., a leadframe panel with multiple device areas that are each connected to an integrated circuit die) is positioned between the top cavity bar 302a and the middle cavity bar 302b. In the illustrated embodiment, dice (not shown) are attached with a bottom surface of the electronic substrate 306. During an encapsulation process, the top and middle cavity bars 302a-302b sandwich the electronic substrate 306. A tape 304 is positioned underneath the electronic substrate 306 and is supported by the bottom cavity bar 302c. FIG. 3B illustrates an arrangement in which the cavity bars 302a-302c and tape 304 are tightly pressed around the electronic substrate 306. As a result, the dice on the bottom surface of the electronic substrate 306 may receive some pressure from the underlying bottom cavity bar 302c. The tape 304 is arranged to reduce this pressure and thereby help prevent damage to the dice.

When the cavity bars and tape are tightly compressed around the electronic substrate 306, they form one or more mold cavities around device areas on the electronic substrate 306. This is shown in FIG. 3C, which is a diagrammatic side view of a portion of the structures illustrated in FIG. 3B. FIG. 3C illustrates a top cavity bar 302a with a recess 314, an electronic substrate 306, a middle cavity bar 302b with an opening 316, a tape 304, and a bottom cavity bar 302c. A die 308 is physically and electrically attached to a device area on the electronic substrate 306 via solder bumps 310. The recess 312 and the opening 316 cooperate to form a mold cavity 312 around the device area on the electronic substrate 306. In the illustrated embodiment, for example, the recess 312 in the upper cavity bar 302a defines an upper portion of the mold cavity 312, which is located over the top surface of the electronic substrate 306. The opening 316, which penetrates entirely through the middle cavity bar 302b, defines a lower portion of the mold cavity 312, which is situated below the bottom surface of the electronic substrate 306. The die 308, which is attached with the bottom surface of the electronic substrate 306, is disposed within the opening 316. In FIG. 3C, the tape 304 is pressed against the back surface of the die 308 and the bottom surface of the middle cavity bar 302b. Thus, the tape 304 helps seal off the bottom of the mold cavity 312. When the cavity bars 302a-302c, tape 304 and electronic substrate 306 are pressed together in the above manner, the mold cavity 312 forms a sealed space around the device area on the electronic substrate 306 that is arranged to receive and contain molding material. When molding material is injected into the mold cavity 312, the molding material fills in gaps between the walls of the mold cavity 312, the electronic substrate 306, the tape 304 and the die 308. The molding material generally conforms to the shape of the mold cavity 312 to form a protective housing around the die 308, while leaving its back surface 318 substantially uncovered with molding material.

During encapsulation, the bottom cavity bar 302c applies pressure towards the back surface 318 of the die 308. The tape 304, which is sandwiched between the die 308 and the bottom cavity bar 302c, is arranged to help absorb this pressure. That is, the tape 304 acts as a cushion between the die 308 and the underlying bottom cavity bar 302c. In various implementations, the tape 304 is flexible and elastic such that it forms a tight seal with the die 308 when the middle and bottom cavity bars are pressed together. In addition to protecting the die, this arrangement also helps to prevent molding material from coming in contact with its back surface 318 of the die 308.

The dimensions and composition of the tape 304 may vary widely, depending on the needs of a particular application. Generally, the tape 304 is made of a suitably malleable and/or elastic material, such as plastic. The thickness of the tape 304 may be approximately between 1 and 4 mils, although thinner and thicker tapes also work well for particular applications. In a preferred embodiment, the tape 304 is non-adhesive. That is, the tape 304 can be made of a material that does not substantially adhere to the back surface 318 of the die 308. As will be discussed later in the application, various designs contemplate a non-adhesive tape 304 that can be conveyed and/or coiled such that used portions of the tape 304 can be easily and quickly replaced with new portions in preparation for a repeat of the encapsulation process.

Figure 4:
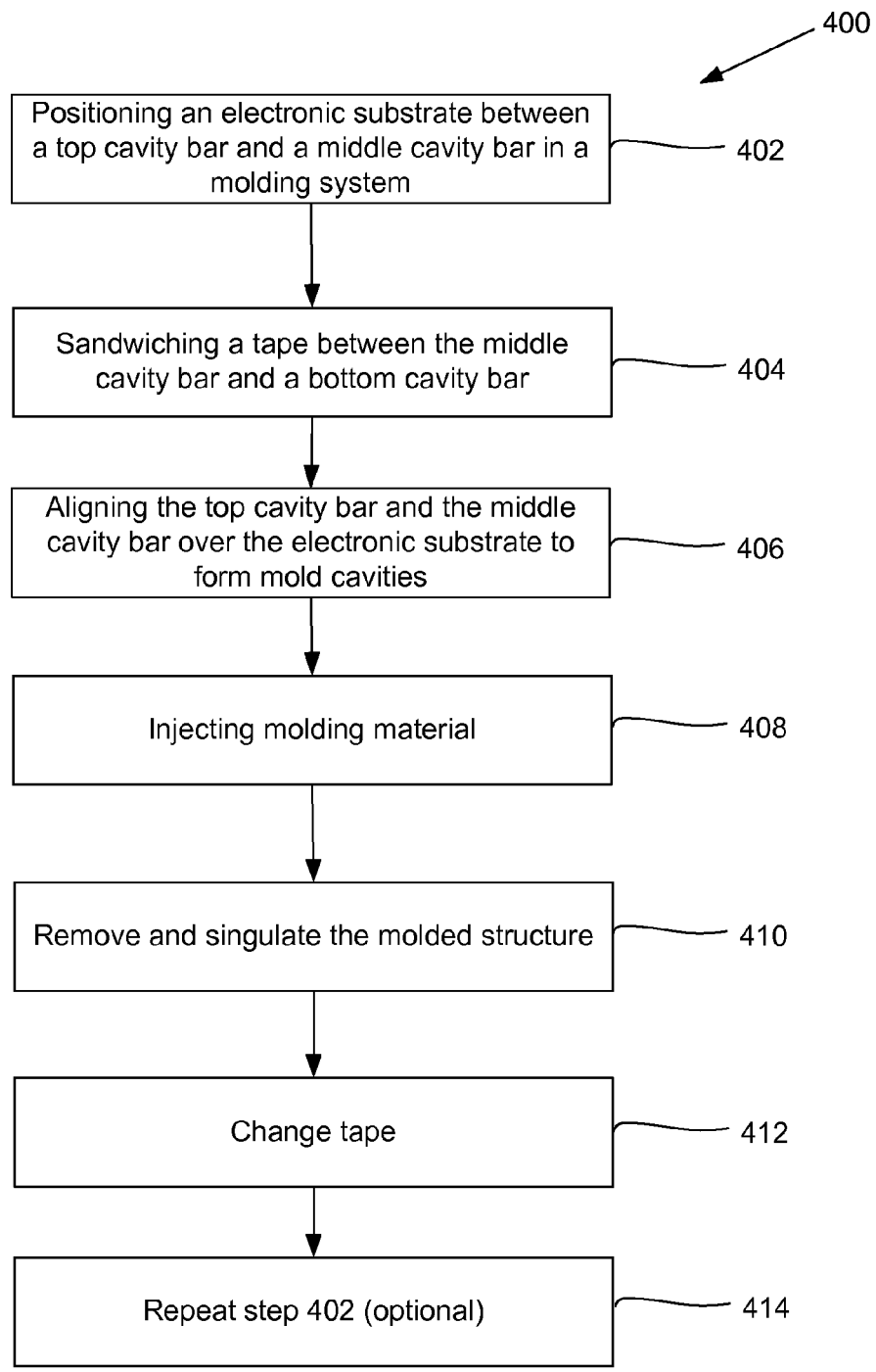
FIG. 4 is a flow diagram that illustrates a method of packaging integrated circuits according to a particular embodiment of the present invention.
Figure 5A:
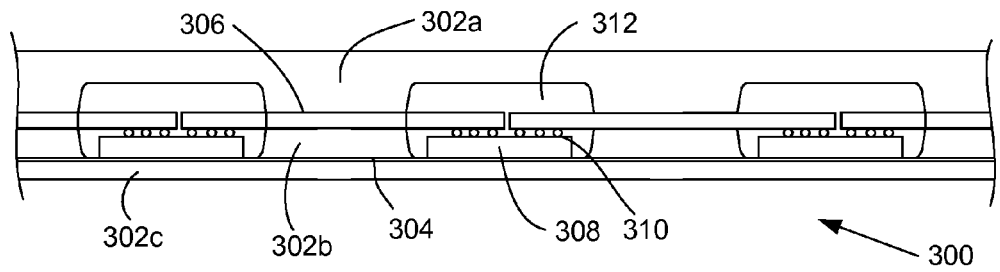
FIGS. 5A-5C are diagrammatic side views of various operations in the method illustrated in FIG. 4.

Referring next to FIG. 4 in combination with FIGS. 5A-5E, an example method for packaging integrated circuits using the above molding system 300 will be described. FIG. 5A is a diagrammatic side view of the molding system 300 illustrated in FIG. 3B. Initially, at step 402 of FIG. 4, an electronic substrate 306 is positioned between the top cavity bar 302a and the middle cavity bar 302b. The bottom surface of the electronic substrate 306 is electrically and physically connected to multiple integrated circuit dice 308. The tape 304 is sandwiched between the middle cavity bar 302b and the bottom cavity bar 302c (step 404) and helps to protect the dice 308, as previously discussed. The top cavity bar 302a and the middle cavity bar 302b are aligned over the electronic substrate 306 to form mold cavities 312 around corresponding dice (step 406). It should be noted that steps 402, 404 and 406 may take place in any order and/or simultaneously.

The top, middle and bottom cavity bars 302a-302c are arranged to form and seal mold cavities 312 around device areas on the electronic substrate 306. In various embodiments, each cavity bar 302a-302c takes the form of a sheet with opposing top and bottom surfaces. The surfaces of the cavity bars 302a-302d are stacked over one another to form a multilayered, cavity bar structure. As previously discussed, each cavity bar 302a-302d may have various features within it, such as recesses, openings or holes, that line up within the cavity bar structure to form the mold cavities 312. The cavity bars may be made of any resilient material (e.g., metal, etc.) that is suitable for supporting and/or sealing the mold cavities 312.

The electronic substrate 306 may be any structure suitable for supporting and electrically connecting to one or more integrated circuit dice. In the illustrated embodiment, for example, the electronic substrate 306 is a metallic leadframe panel with multiple device areas. The leadframe panel and its associated device areas may be arranged in any suitable manner known to persons of ordinary skill in the art. Each device area is electrically and physically connected to one or more dice using solder bumps, wire bonding, or any other suitable technique.

The dice 308 may be arranged in any suitable manner, depending on the needs of a particular application. In the illustrated embodiment, for example, each die 308 has an active surface and an opposing back surface. The active surface of each die 308 is electrically and physically attached with the bottom surface of the electronic substrate 306 using solder bumps 310. In various embodiments, the back surface of the die 308 may be covered with one or more additional layers. For example, the back surface of the die 308 may be covered with a thermally conductive metal layer.

Figure 5B:
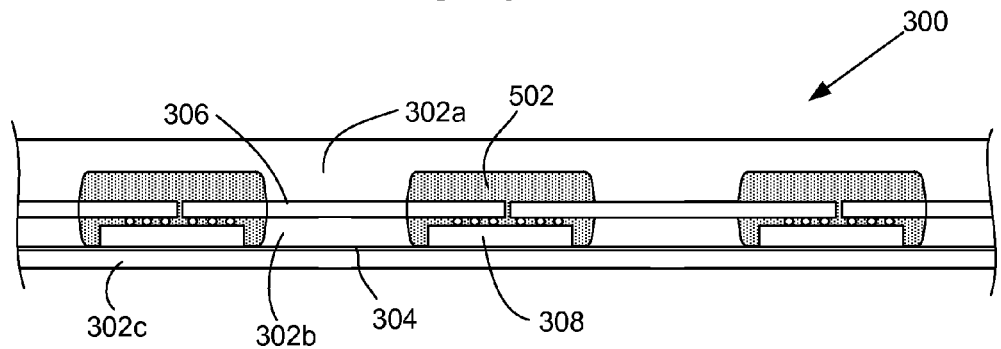
Figure 5C:
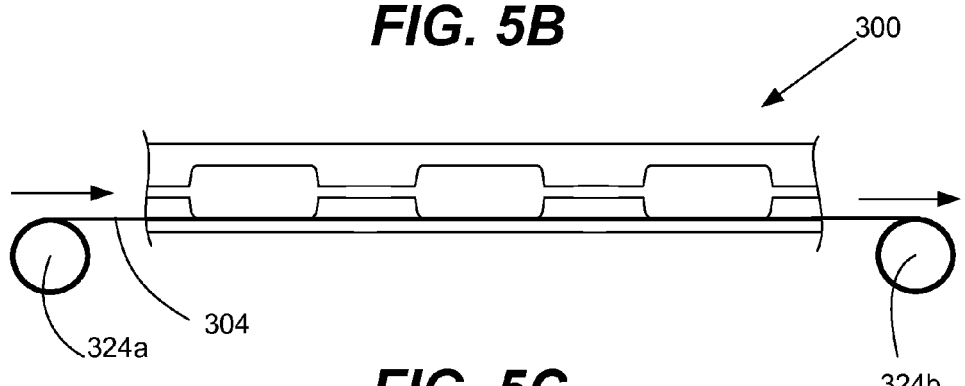

Afterward, molding material 502 is injected into the mold cavities 312 (step 408 and FIG. 5B). The molding material 502 encapsulates portions of the electronic substrate 306, die 308 and tape 304 within each mold cavity 312. The encapsulation process may be performed in any suitable manner known to persons of ordinary skill in the art. In the illustrated embodiment, for example, multiple mold cavities 312 are filled with molding material simultaneously. In FIG. 5C, the molding material in each of the mold cavities is discontinuous with the molding material in any of the other mold cavities, although this is not a requirement.

Figure 5D:
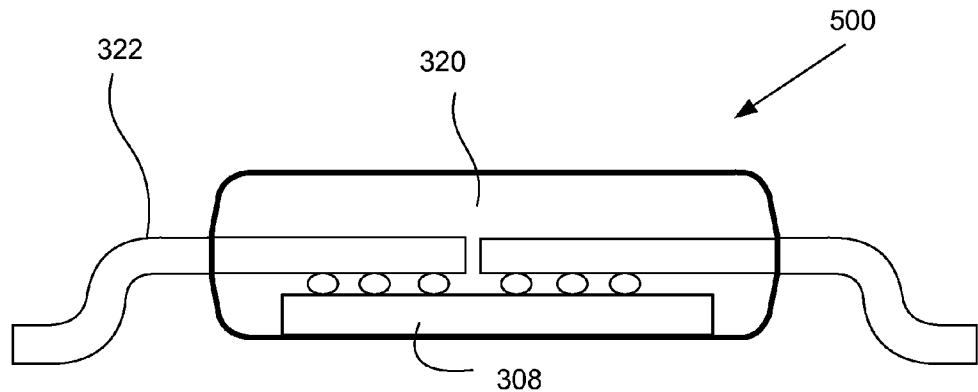
FIG. 5D is a diagrammatic side view of an integrated circuit package according to a particular embodiment of the present invention.
Figure 5E:
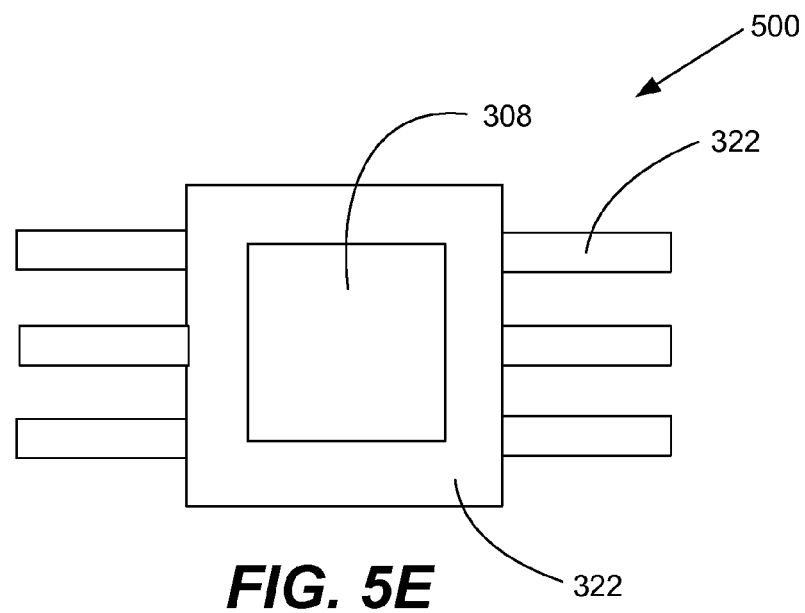
FIG. 5E is a diagrammatic bottom view of the integrated circuit package illustrated in FIG. 5D.

The encapsulated electronic substrate 306 is removed from the molding system 300 (step 410) and later singulated to form multiple integrated circuit packages. Singulation may be performed using any known method, such as sawing or laser cutting. FIG. 5D is a diagrammatic side view of an integrated circuit package 500 according to a particular embodiment of the present invention. The package 500 includes leads 322, exposed die 308, and an outer housing 320 made of molding compound. Generally, the shape of the outer housing 320 generally conforms with that of the mold cavity 312 illustrated in FIGS. 5A and 5B. FIG. 5D illustrates a bottom view of the package 500 illustrated in FIG. 5C. It should be noted that the aforementioned encapsulation process helped ensure that the back surface of the die 308 is exposed on the bottom of the package.

Returning now to step 412 of FIG. 4 in combination with FIG. 5C, the tape may be conveyed and/or moved so that used portions of the tape may be exchanged for new portions of the tape. After an encapsulation process (step 408) and the removal of the encapsulated electronic substrate from the molding system (step 410), it may be undesirable to reuse the same portions of the tape in another encapsulation process. (Of course, although step 412 is shown as coming after the singulation operation of step 410, step 412 may also take place beforehand.) In some instances, for example, the tape may be compressed or deformed from its original state and therefore less useful as a cushion. Additionally, it may be stained with molding material. Therefore, the molding system 300 may include a mechanism for replacing and conveying used portions of the tape. This mechanism may be arranged in any suitable manner. In the illustrated embodiment, for example, the tape 304 extends between a first drum 324a and a second drum 324b. The ends of the tape 304 are coiled around or otherwise attached with the drums 324a-324b. The first and second drums 324a-324b are arranged to uncoil and coil, respectively, so that old portions of the tape that used to underlie the mold cavities are shifted away from their original positions and are replaced with fresh portions of the tape. Afterward, another electronic substrate may be placed within the molding system and the encapsulation process may be repeated (step 414).

Figure 6:
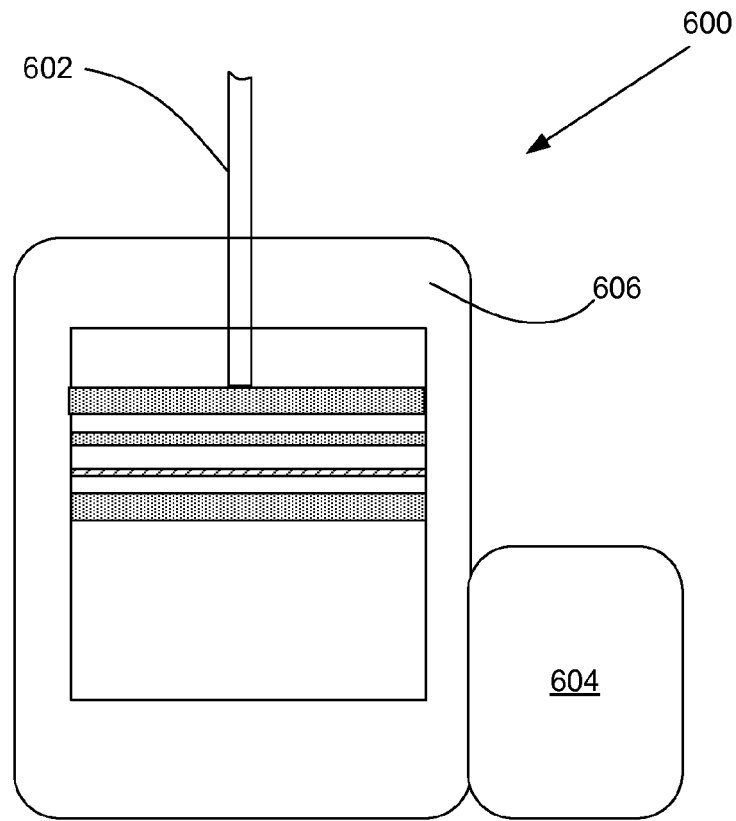
FIG. 6 is a diagrammatic side view of a molding system (including a support structure, control module and injective unit) in accordance with a particular embodiment of the present invention.

Referring now to FIG. 6, a molding system 600 according to another embodiment of the present invention will be described. The molding system 600 includes a support structure 606, a control module 604 and an injection unit 602. The support structure 606 is arranged to support and align the top cavity bar 302a, the middle cavity bar 302b, the bottom cavity bar 302c and the tape 304. In some implementations, the support structure 606 includes a mechanical positioning system that allow one or more of the cavity bars 302a-302c and tape 304 to be moved in at least one dimension. The injection unit 602 is fluidly coupled with a source of molding material (not shown) and is arranged to inject the molding material into the mold cavities formed within the cavity bars. The control module 604 allows a user to control the molding system 600 so that it performs the operations described in connection with method 400 of FIG. 4. In various implementations, the control module 604 includes memory, one or more processors and one or more input/output devices (e.g., buttons, dials, displays etc.) The memory, which may be any suitable computer readable medium, stores instructions for performing one or more of the operations of method 400 of FIG. 4. The one or more processors are configured to execute these instructions.

Although only a few embodiments of the invention have been described in detail, it should be appreciated that the invention may be implemented in many other forms without departing from the spirit or scope of the invention. In the foregoing description, for example, many of the figures include cavity bars with multiple, distinct mold cavities, where each mold cavity surround only one device area on an electronic substrate. However, the present invention also contemplates embodiments where a single mold cavity covers multiple device areas and multiple dice on the electronic substrate. As a result, after encapsulation the mold compound extends continuously between multiple device areas and/or may have a generally constant thickness over multiple device areas. The resulting mold structure can then be singulated into individual IC packages. It should also be appreciated that any of the methods described herein may have one or more steps reordered, replaced, modified or deleted. For example, method 400 of FIG. 4 is a flow diagram in which step 412 (change tape) follows step 410 (remove and singulate the molded structure.) Since step 412 is performed to prepare for a repeat of the encapsulation process, it can of course be performed before or during the singulation of the molded structure. It should also be noted that the present invention contemplates features that depart from the exact arrangements shown in the drawings. For example, the above figures and descriptions refer to a die whose back surface is exposed on the outside of the package, positioned flush against a tape, and/or is situated at the bottom of a mold cavity. Accordingly, in some designs there may be other structures or layers that make up or overlie the back surface of the die. For example, the back surface of the die may include one or more metal layers or be positioned on a die attach pad. As a result, in some embodiments these structures may be pressed flush against a tape, exposed on the outside of a package and/or positioned at the bottom of a mold cavity. Additionally, it should be noted that although the title of the present application is "Three Piece Mold Cavity Design for Packaging Integrated Circuits," it should be appreciated that the reference to "three pieces" relates to various embodiments which include a top cavity bar, a middle cavity bar and a lower cavity bar. The present invention, however, is not necessarily limited to such embodiments and contemplates a wide variety of packaging/molding systems, including molding systems that have fewer or more cavity bars and any suitable number of components, elements, structures and/or features. Therefore, the present embodiments should be considered as illustrative and not restrictive and the invention is not limited to the details given herein, but may be modified within the scope and equivalents of the appended claims.

What is claimed is:

1. A molding system for use in packaging integrated circuits, comprising:
   a top cavity bar having a flat bottom surface wherein there is a top cavity bar recess in the flat bottom surface;
   a middle cavity bar that is positioned below the top cavity bar, wherein the top and middle cavity bars are arranged to sandwich an electronic substrate when the electronic substrate is positioned between the top and middle cavity bars, wherein the top and middle cavity bars are further arranged to help form one or more mold cavities over the electronic substrate;
   a tape that is positioned below the middle cavity bar and is arranged to cover and relieve pressure on a bottom of each mold cavity;
   a bottom cavity bar that is positioned below and arranged to support the tape;
   an injection unit that is arranged to be coupled with the mold cavities, wherein the injection unit is further arranged to inject a molding material into the mold cavities to encapsulate portions of the electronic substrate and wherein the molding system and injection unit are arranged to fill the entire top cavity bar recess with the molding material; and
   an electronic substrate populated with an integrated circuit die, the electronic substrate including a top surface and an opposing bottom surface wherein:
   the integrated circuit die on the electronic substrate includes an active surface and an opposing back surface;
   the active surface of the integrated circuit die is directly physically and electrically connected to the bottom surface of the electronic substrate with at least one solder joint;
   the top surface of the electronic substrate underlies the top cavity bar recess and is in contact with the flat bottom surface of the top cavity bar;
   the electronic substrate is in contact with and sandwiched between the top and middle cavity bars; and
   the back surface of the integrated circuit die is pressed flush against the tape.

2. A molding system as recited in claim 1, wherein:
   the top cavity bar includes one or more recesses that include the top cavity bar recess; and
   the middle cavity bar includes one or more openings that penetrate entirely through the middle cavity bar, wherein one of the recesses of the top cavity bar is arranged to cooperate with one of the openings in the middle cavity to form to help form one of the mold cavities.

3. A molding system as recited in claim 1, wherein:
   the tape includes first and second portions, wherein the first portions of the tape are positioned underneath the mold cavities; and
   the molding system is arranged to convey the tape past the mold cavities such that the position of the first portions of the tape are taken by the second portions of the tape.

4. A molding system as recited in claim 1, further comprising a first drum and a second drum, wherein:
   the tape extends between the first and second drums and is partially coiled around the first and second drums;
   the first and second drums are arranged to uncoil and coil the tape respectively to convey portions of the tape past the one or more mold cavities.

5. A molding system as recited in claim 1, wherein the tape is non-adhesive and formed from a flexible plastic.

6. A molding system as recited in claim 1, wherein the electronic substrate is populated with a plurality of integrated circuit dice and wherein
   each one of the mold cavities is positioned around at least one of the integrated circuit dice.

7. A molding system as recited in claim 6, wherein the electronic substrate is a leadframe panel including one or more device areas, each device area supporting at least one of the integrated circuit dice.

8. A molding system as recited in claim 1, wherein:
   the top cavity bar includes a plurality of recesses that includes the top cavity bar recess;
   the middle cavity bar includes a plurality of openings that penetrate entirely through the middle cavity bar;
   the molding system is arranged to align the top cavity bar and the middle cavity bar to help form a plurality of mold cavities from the plurality of recesses in the top cavity bar and the plurality of openings in the middle cavity bar; and
   the injection unit is arranged to fill each one of the plurality of mold cavities with the molding material such that the molding material within each mold cavity is discontinuous with the molding material of the other mold cavities.

9. A molding system as recited in claim 1, wherein:
   the tape includes a top surface and an opposing bottom surface, the top surface of the tape being arranged to cover and cushion the bottom of each mold cavity; and
   the bottom cavity bar includes a top surface, wherein the top surface of the bottom cavity bar is arranged to support and be positioned flush against the bottom surface of the tape.

10. A molding system as recited in claim 1 wherein:
    the middle cavity bar includes a middle cavity bar aperture that penetrates entirely through the middle cavity bar; and
    the integrated circuit die and the at least one solder joint are disposed within the middle cavity bar aperture.

11. A molding system as recited in claim 10 further comprising the molding material wherein the molding material fills substantially the entire top cavity bar recess and at least partially encapsulates the integrated circuit die, the at least one solder joint and the electronic substrate.

* * * * *